United States Patent
Shimo-Ohsako et al.

(10) Patent No.: US 7,115,681 B2
(45) Date of Patent: *Oct. 3, 2006

(54) RESIN COMPOSITION

(75) Inventors: Kanji Shimo-Ohsako, Settsu (JP); Takashi Itoh, Otsu (JP); Masaru Nishinaka, Otsu (JP); Shigeru Tanaka, Settsu (JP); Mutsuaki Murakami, Settsu (JP)

(73) Assignee: Kaneka Corporation, Osaka (JP)

( * ) Notice: Subject to any disclaimer, the term of this patent is extended or adjusted under 35 U.S.C. 154(b) by 0 days.

This patent is subject to a terminal disclaimer.

(21) Appl. No.: 10/482,897

(22) PCT Filed: Jul. 8, 2002

(86) PCT No.: PCT/JP02/06890

§ 371 (c)(1),
(2), (4) Date: Jan. 5, 2004

(87) PCT Pub. No.: WO03/006553

PCT Pub. Date: Jan. 23, 2003

(65) Prior Publication Data

US 2004/0176526 A1 Sep. 9, 2004

(30) Foreign Application Priority Data

Jul. 9, 2001 (JP) ............................. 2001-208606
Nov. 14, 2001 (JP) ............................. 2001-348287
Nov. 14, 2001 (JP) ............................. 2001-348303

(51) Int. Cl.
*C08L 79/08* (2006.01)

(52) U.S. Cl. ..................... 524/538; 525/420; 525/423; 525/424; 525/436

(58) Field of Classification Search ............... 525/423, 525/436, 420, 424; 528/289, 291, 296, 353; 524/538

See application file for complete search history.

(56) References Cited

U.S. PATENT DOCUMENTS 6,790,930 B1 * 9/2004 Kikuchi et al. ............. 528/353

FOREIGN PATENT DOCUMENTS

| JP | 09-008458 | 1/1997 |
| JP | 10-107447 | 4/1998 |
| WO | WO 01/34678 A1 | 5/2001 |

\* cited by examiner

*Primary Examiner*—Ana Woodward
(74) *Attorney, Agent, or Firm*—Hogan & Hartson LLP

(57) ABSTRACT

The present invention provides a resin composition comprising a polyimide containing particular dianhydride and diamine, and an epoxy resin. The resin composition can be bonded at a relatively low temperature, has excellent heat resistance, adhesion property, soldering heat resistance and retaining ratio of peeling strength after PCT. By forming a circuit using the polyimide resin sheet or the polyimide resin sheet with metal foil, which comprises the resin composition, according to the semi-additive method, a printed wiring board having a good wiring shape, firm adhesion of circuit and high insulating resistance in the microcircuit space can be obtained.

8 Claims, No Drawings

RESIN COMPOSITION

TECHNICAL FIELD

The present invention relates to a resin composition which can be bonded and cured at a comparatively low temperature, is soluble in a solvent and has excellent heat resistance and adhesion. The composition of the present invention is useful as the adhesive used for flexible printed circuit boards, TAB (Tape Automated Bonding) tapes, materials for lamination and materials for fixing automobile parts, utilizing the excellent heat resistance and adhesive property.

The present invention also relates to a thermosetting resin sheet and a thermosetting resin sheet with metal foil for preparing printed wiring boards which are widely used for electric and electronic apparatuses. Further, the present invention relates to a printed wiring board and a process for preparing the same and more specifically, to a high-density printed wiring board prepared by the semi-additive process and a process for preparing the same, and to a build-up multilayer printed wiring board to which the aforesaid method is applicable and a process for preparing the same.

BACKGROUND ART

In recent years, high function, high performance and small-size electronic apparatuses have been developed, and along with these developments, there have been increasing demands for small-size, light-weight electronic parts to be used in these apparatuses. For this reason, with respect to a semiconductor device packaging method and wiring materials or wiring parts packaged therein, there have been ever-increasing demands for those having high density, high functions and high performance. In particular, materials having a superior adhesive property, which can be desirably used for high-density packaging materials such as semiconductor packages, COL (chip-on-lead) packages, LOC (lead-on-chip) packages and MCM (Multi Chip Module), printed wiring board materials such as multilayer FPCs, aerospace and aircraft materials and fixing materials for automobile parts are being wanted.

Conventionally, regarding semiconductor packages and other packaging materials, acrylic resin, phenolic resin, epoxy resin and polyimide resin have been known as an adhesive which exhibits superior mechanical properties, heat resistance and insulating property. However, phenolic resin adhesives and epoxy resin adhesives which have a superior adhesiveness have inferior flexibility and acrylic resin adhesives which have superior flexibility have inferior heat resistance.

In order to solve these problems of adhesives, using a polyimide resin has been investigated. Among various organic polymers the polyimide resin is superior in heat resistance and thus used in a wide range of fields from aerospace and aircraft fields to electronic communication fields and also used as an adhesive. However, the polyimide resin adhesive, which has high heat resistance, requires a high temperature of approximately 300° C. and a high pressure in order to adhere and in addition, the adhesion strength is not so high. Moreover, when used for semiconductor package and other packaging materials, imide resin adhesives had problems that regarding solder heat resistance and PCT (pressure cooker test) resistance, swelling occurred after solder packaging process and that the adhesion strength decreased remarkably after the PCT process.

Printed wiring boards having a circuit on the surface are widely used in order to package electronic parts and semiconductor devices. With the recent demand of miniaturization and high functions in electronic equipment, high densification and thinning of circuits are strongly desired in printed wiring boards. Particularly, the establishment of a method of forming microcircuit in which the line/space interval is at most 25 µm/25 µm is an important problem in the printed wiring board field.

A method called the semi-additive process is being considered as a method for preparing such a high density printed wiring board and as an example, the printed wiring board is prepared in the following steps.

After a plating catalyst such as a palladium compound is applied on the surface of an insulating substrate made of polymer material, electroless copper plating is conducted with the plating catalyst as the nucleus and a thin metal coating is formed on the surface of the insulating substrate 1.

A resist coating is applied to the surface of the copper coating formed in the above manner and certain portions of the resist coating where the formation of the circuit is planned are removed. Electroplating of copper is then conducted with the area in which the electrolessly plated coating is exposed as the feeding electrode and a second metal coating is formed thereon to form a circuit.

After the resist coating is removed, electrolessly plated copper coating is removed by etching. At this time, the surface of the electroplated copper coating is also etched in about a thickness of the electrolessly plated copper coating and the thickness and width of the circuit pattern decreases.

Furthermore, nickel plating or gold plating is conducted to the surface of the formed circuit pattern according to need to prepare the printed wiring board.

In the semi-additive process, because the circuit is prepared by applying a circuit pitch based on the resolution of the photosensitive plating resist, a microcircuit can be accurately formed, compared to the process called the subtractive process in which a circuit is formed by etching thick metallic foil.

However, the semi-additive process used for preparing a printed wiring board having a microcircuit is known to have the following problems.

The first problem is the problem of adhesion between the formed circuit electrode and the substrate. As mentioned before, the space between the substrate and the circuit electrode is in electrolessly plated copper layer. The electrolessly plated layer is formed in the presence of a catalyst applied on the surface as the active site and therefore is not essentially considered to be adhesive to the substrate. When the unevenness of the substrate surface is great, the adhesion is favorably maintained by the anchor effect, but as the board surface becomes smooth, naturally, the adhesion tends to become weaker.

Hence, a step for roughening the surface of the polymer material which is the substrate is necessary in the semi-additive process and usually, unevenness of approximately 3 to 5 µm based on Rz value is created. This unevenness on the substrate surface is not a practical problem when the line/space value of the circuit to be formed is at least 30 µm/30 µm. However, the unevenness is a great problem in forming a circuit with a line width of at most 30 µm/30 µm, particularly at most 25 µm/25 µm, as this very thin, high-density circuit line is influenced by the unevenness of the board surface and it becomes difficult to form a circuit having a good shape.

Therefore, in forming a circuit with a line/space value of at most 25 μm/25 μm, the flatness is preferably at most 3 μm, more preferably at most 1 μm on a Rz value basis and good adhesiveness is necessary.

The second problem of the semi-additive process lies in the etching step. The electrolessly plated copper layer used as the feeding layer for electroplating copper layer is a layer unnecessary for the circuit and must be removed by etching after the electroplating copper layer is formed. However, when the etching time for removing the electrolessly plated copper layer is long, though the electrolessly plated copper layer is completely removed and insulating reliability becomes high, the circuit pattern of the electroplated copper layer also decreases in width and thickness and producing an accurate circuit pattern with good reproductivity becomes difficult. On the other hand, when the etching time is short, though a good circuit pattern can be obtained, electrolessly plated copper layer remains in some part and insulating reliability is low. In other words, forming an accurate circuit and ensuring high insulating reliability is not compatible. The thinner the line width and thickness becomes, the more serious the problem.

The third problem is the electric insulation. When the line/space value is at most 25/25 μm, maintaining insulation between the circuits becomes difficult in the conventional material. In order to achieve high insulating property, conducting the etching of the electrolessly plated copper layer completely and using a material having a larger insulation resistance than that of the conventional material is important.

Furthermore, the fourth problem is the dielectric characteristics of the resin material. As the clock frequency of the semiconductor increases, reducing signal delay and transmission loss, that is, low dielectric constant and low dielectric loss tangent in a GHz band are required for the wiring board materials. However, the conventional materials, for example, epoxy resins, have a relative dielectric constant of 3.5 to 4.0 and a dielectric loss tangent of approximately 0.03 to 0.05 and therefore, new resins which have a low dielectric constant and low dielectric loss tangent are in demand.

DISCLOSURE OF INVENTION

An object of the present invention is to provide a resin composition having excellent soldering heat resistance, heat resistance, PCT resistance and adhesive property, which can be bonded at a comparatively low temperature, for example, at a temperature of not more than 250° C.

Another object of the present invention is to form a fine metal circuit layer firmly bonded onto a polymer material having a smooth surface in a process of preparing a printed wiring board. Furthermore, still another object of the present invention is to provide a printed wiring board such that when forming a microcircuit by the semi-additive process, degradation of circuit shape in the etching step for removing the feeding layer is minimized; the insulating property between the circuits is ensured by being able to remove the feeding layer in the etching process; the insulating property between the circuits and layers is ensured by using a resin material having a high insulating property; and that a high frequency signal can be processed using a resin material having excellent dielectric characteristics, and a process for preparing the printed wiring board. Yet another object of the present invention is to provide a polyimide resin sheet and a polyimide resin sheet with metal foil, which are suitable for the above-mentioned process for preparing a printed wiring board.

That is, the first resin composition of the present invention relates to a resin composition comprising a polyimide resin and a thermosetting resin, the polyimide resin being represented by the following formula (1):

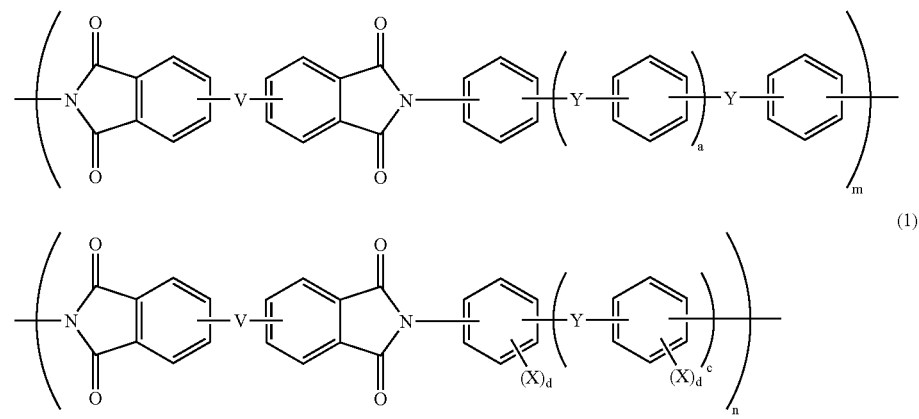

(1)

wherein each of m and n is an integer, m+n being at least 1; V represents a divalent group selected from the group consisting of —O—, —O-T-O— and —C(=O)—O-T-O (C=O)—; T represents a divalent organic group; Y represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond; each of a, b and c is independently an integer of at least 0 to at most 5; X independently represents one or at least two kinds of functional group selected from the group consisting of —OH, —COOH, —OCN and —CN; and d is an integer of 1 to 4.

The second resin composition of the present invention is resin composition for adhesive which comprises (A) a polyimide resin obtained by allowing an acid dianhydride component to react with a diamine component and (B) a thermosetting resin, the acid dianhydride component containing an acid dianhydride (a) represented by the following formula (2):

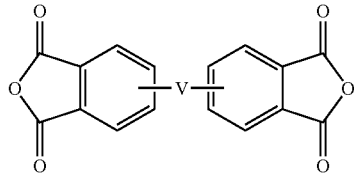
(2)

wherein V represents a divalent group selected from the group consisting of —O—, —O-T-O— and —C(=O)—O-T-O(C=O)—, and T represents a divalent organic group; and the diamine component containing diamine (b) represented by the following formula (3):

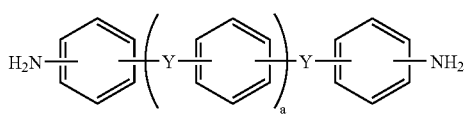
(3)

wherein Y represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond, each of a and b is independently an integer of at least 0 to at most 5.

The third resin composition of the present invention is resin composition for adhesive, comprising (A) a polyimide resin obtained by allowing an acid dianhydride component to react with a diamine component and (B) a thermosetting resin, the acid dianhydride component containing an acid dianhydride represented by formula (2) and the diamine component containing diamine represented by the following formula (4):

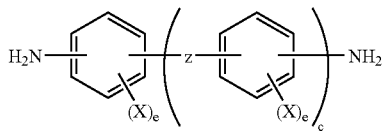
(4)

wherein Z represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond; each of b and c is independently an integer of at least 0 to at most 5; X independently represents one or at least two kinds of functional group selected from the group consisting of —OH, —COOH, —OCN and —CN; and e is an integer of 1 to 4.

The fourth resin composition of the present invention is that in the second resin composition, the diamine component further contains diamine represented by formula (4).

The fifth resin composition of the present invention is that in the third or fourth resin composition, the diamine represented by the above-mentioned formula (4) is diamine containing a hydroxyl group.

The sixth resin composition of the present invention is that in any of the first to fifth resin compositions, T in the formula (2) is at least one kind of acid dianhydride selected from the group consisting of groups represented by

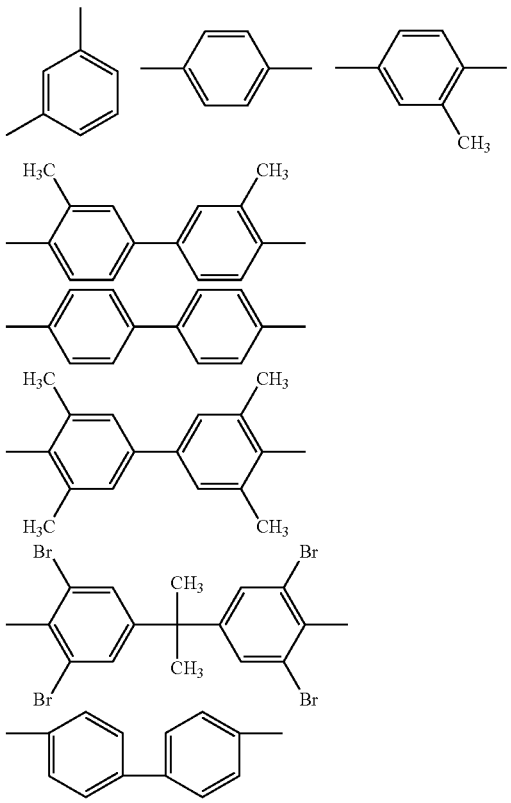

and groups represented by

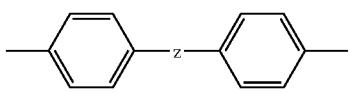

in which Z represents —C$_q$H$_2$q- and q is an integer of at least 1 to at most 5.

The seventh resin composition of the present invention is that in the fourth resin composition, the diamine component contains 1 to 99% by mole of diamine (b) and 99 to 1% by mole of diamine represented by the above-mentioned formula (4).

The eighth resin composition of the present invention is that in the second or fourth resin composition, the diamine (b) is diamine having an amino group at meta position, which is represented by the formula (5):

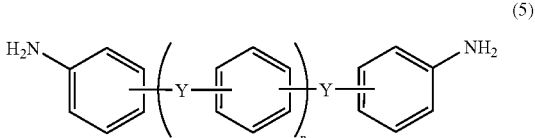
(5)

wherein Y represents an independent divalent organic group selected from the group consisting of —C(=O)—, —SO₂—, —O—, —S—, —(CH₂)$_b$—, —NHCO—, —C(CH₃)₂—, —C(CF₃)₂—, —C(=O)O— and a single bond; and each of a and b is independently an integer of at least 0 to at most 5.

The ninth resin composition of the present invention is that in the third or fourth resin composition, the diamine represented by formula (4) is 3,3'-dihydroxy-4,4'-diaminobiphenyl represented by the following formula:

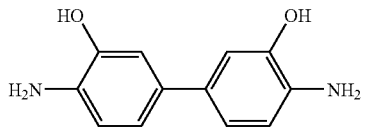

The tenth resin composition of the present invention is that in any of the first to fourth resin compositions, the polyimide resin (A) has a glass transition temperature Tg of at most 350° C.

The eleventh resin composition of the present invention is that in any of the first to fourth resin compositions, the resin composition contains a solvent having a boiling point of at most 160° C.

The first resin sheet of the present invention is a resin sheet containing any of the first to fourth resin compositions.

The second resin sheet of the present invention is that in the first resin sheet, the resin sheet is formed on a support.

The third resin sheet of the present invention is that in the second resin sheet, the support contacting with the resin sheet has a surface roughness Rz of at most 1 μm.

The fourth resin sheet of the present invention is that in the second resin sheet, the support is a synthetic resin film.

The fifth resin sheet of the present invention is that in the first resin sheet, the resin sheet has a protective film on the surface.

The first resin sheet with metal foil of the present invention comprises a metal foil and the first resin sheet formed on the metal foil.

The second resin sheet with metal foil of the present invention is that in the first resin sheet with metal foil, the metal foil contacting with the resin sheet has a surface roughness Rz of at most 3 μm.

The first printed wiring board of the present invention is a printed wiring board obtained by using the first resin sheet.

The first process for preparing a printed wiring board of the present invention is a process using the first resin sheet, and the process comprises the steps of (i) laminating by a method which involves heating and/or pressing, while inserting a resin sheet between a metal foil and an inner layer wiring board having a circuit pattern, (ii) removing the metal foil from the surface of the resulting laminate, (iii) drilling a hole from an exposed resin surface to an electrode on the inner layer wiring board, (iv) panel plating by a chemical plating method, (v) forming a resist pattern by using photosensitive plating resist, (vi) forming a circuit pattern by electroplating, (vii) peeling the resist pattern, and (viii) removing the chemically plated layer exposed by the resist pattern peeling.

The second process for preparing a printed wiring board of the present invention is a process using the first resin sheet with metal foil, and the process comprises the steps of (i) laminating by a method which involves heating and/or pressing processes, while facing the resin face of the resin sheet with metal foil with the circuit face of the inner layer wiring board having a circuit pattern, (ii) removing the metal foil from the surface of the resulting laminate, (iii) drilling a hole from an exposed resin surface to an electrode on the inner layer wiring board, (iv) panel plating by a chemical plating method, (v) forming a resist pattern by using photosensitive plating resist, (vi) forming a circuit pattern by electroplating, (vii) peeling the resist pattern, and (viii) removing the chemical plated layer exposed by the resist pattern peeling.

BEST MODE FOR CARRYING OUT THE INVENTION

The resin composition of the present invention contains a polyimide resin component (A) obtained by subjecting polyamide acid which is prepared by allowing an acid dianhydride component containing acid dianhydride (a) represented by the following formula (2) to react with a diamine component, to dehydration and ring-closing, and a thermosetting resin (B).

The component (A) is obtained by allowing the acid dianhydride component and the diamine component to react with each other, and the acid dianhydride component contains the acid dianhydride component (a) represented by formula (2).

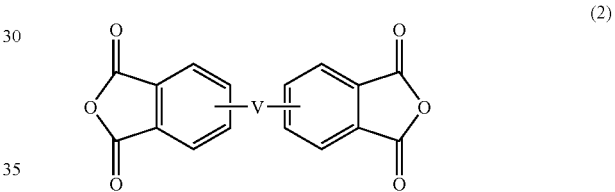

wherein V represents a divalent group selected from the group consisting of —O—, —O-T-O— and —C(=O)—O-T-O(C=O)—, and T represents a divalent organic group.

In particular, T in the formula (2) is preferably at least one kind of acid dianhydride selected from the group consisting of groups represented by

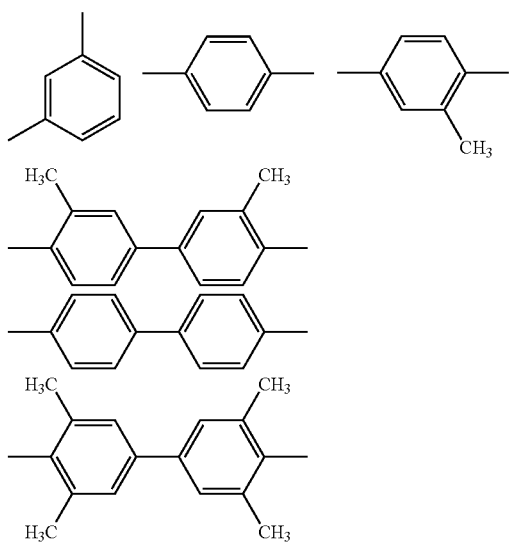

-continued

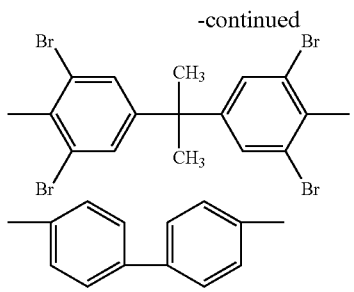

and groups represented by

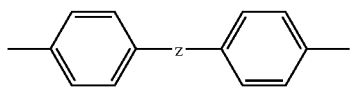

in which Z represents —C$_q$H$_{2q}$- and q is an integer of at least 1 to at most 5 from the viewpoint that a polyimide resin which is superior in the soldering heat resistance and PCT resistance can be obtained.

It is also preferable to use the acid dianhydrides represented by the following formula from the viewpoint that a polyimide resin which is superior in the soldering heat resistance and PCT resistance can be obtained.

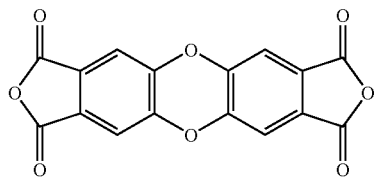

The acid dianhydride represented by the formula (2) may be used alone or in combination of two or more. In the formula (2), a hydrocarbon group such as methyl group and ethyl group, and a halogen group such as Br and Cl may be introduced into each benzene ring.

Specific examples of the acid dianhydride represented by the formula (2) include 4,4'-oxydiphthalic anhydride, 3,4'-oxydiphthalic anhydride, 3,3'-oxydiphthalic anhydride, 4,4'-(4,4'-isopropylidene diphenoxy)bis(phthalic anhydride), 4,4'-hydroquinonebis(phthalic anhydride), 2,2-bis(4-hydroxyphenyl)propane dibenzoate-3,3',4,4'-tetracarboxylic dianhydride, 1,2-ethylenebis(trimellitic acid monoester anhydride) and p-phenylenebis(trimellitic acid monoester anhydride). These may be used alone or in combination of two or more. Among these, as the acid dianhydride which provides a thermoplastic polyimide resin having superior solubility and heat resistance, 4,4'-(4,4'-isopropylidene-diphenoxy)bis(phthalic anhydride), 4,4'-hydroquinone bis (phthalic anhydride), 2,2-bis(4-hydroxyphenyl)propane dibenzoate-3,3',4,4'-tetracarboxylic dianhydride and 1,2-ethylenebis(trimellitic acid monoester anhydride) are preferably used.

Among these acid dianhydrides, 4,4'-(4,4'-isopropylindene diphenoxy)bisphthalic anhydride, represented by the formula:

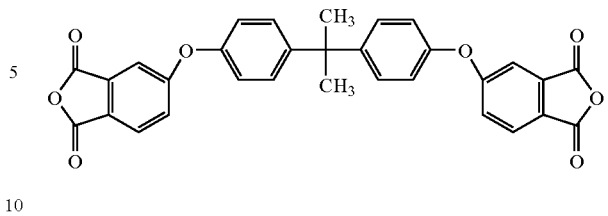

is preferably used from the viewpoint that the resulting polyimide has balanced properties of solubility in solvent, processability and heat resistance.

The acid dianhydride (a) is preferably used in an amount of at least 50% by mole based on the acid dianhydride component.

Examples of acid dianhydrides other than the acid dianhydride represented by formula (2) are aromatic tetracarboxylic dianhydrides such as pyromellitic dianhydride, 3,3', 4,4'-benzophenonetetracarboxylic dianhydride, 3,3',4,4'-diphenylsulfonetetracarboxylic dianhydride, 1,4,5,8-naphthalenetetracarboxylic dianhydride, 2,3,6,7-naphthalenetetracarboxylic dianhydride, 4,4'-oxydiphthalic anhydride, 3,3',4,4'-dimethyldiphenylsilanetetracarboxylic dianhydride, 1,2,3,4-furantetracarboxylic dianhydride, 4,4'-bis(3,4-dicarboxyphenoxy)diphenylpropane acid dianhydride, 3,3',4,4'-biphenyltetracarboxylic dianhydride, 2,3,3', 4'-biphenyl tetracarboxylic dianhydride and p-phenylenediphthalic anhydride, and 4,4'-hexafluoroisopropylidenediphthalic anhydride, but not limited to these.

The above-mentioned component (A) is preferably obtained by using diamine (b) represented by the following formula (3):

(3)

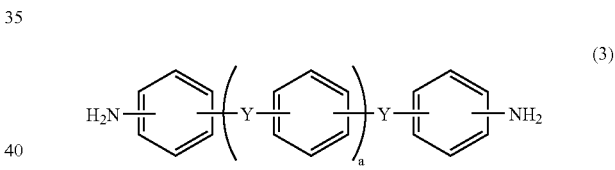

Y represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond, each of a and b is independently an integer of at least 0 to at most 5. In the formula (3), a is preferably an integer of at least 1 to at most 5. Further, b is preferably an integer of at least 1 to at most 5.

The diamine (b) may be used alone or in combination of two or more. In the formula (3), a plurality of Y may be the same or different in the repeat units, and a hydrocarbon group such as methyl group and ethyl group, and a halogen group such as Br and Cl may be introduced into each benzene ring.

Examples of the diamine represented by the formula (3) are 4,4'-diaminodiphenyl ether, 3,4'-diaminodiphenyl ether, 3,3'-diaminodiphenyl ether, 4,4'-diaminodiphenyl thioether, 3,4'-diaminodiphenyl thioether, 3,3'-diaminodiphenyl thioether, 3,3'-diaminodiphenylmethane, 3,4'-diaminodiphenylmethane, 4,4'-diaminodiphenylmethane, 4,4'-diaminodiphenyl sulfone, 3,4'-diaminodiphenyl sulfone, 3,3'-diaminodiphenyl sulfone, 4,4'-diaminobenzanilide, 3,4'-diaminobenzanilide, 3,3'-diaminobenzanilide, 4,4'-diaminobenzophenone, 3,4'-diaminobenzophenone, 3,3'-diaminobenzophenone, bis[4-(3-aminophenoxy)phenyl]

methane, bis[4-(4-aminophenoxy)phenyl]methane, 1,1-bis [4-(3-aminophenoxy)phenyl]ethane, 1,1-bis[4-(4-aminophenoxy)phenyl]ethane, 1,2-bis[4-(3-aminophenoxy) phenyl]ethane, 1,2-bis[4-(4-aminophenoxy)phenyl]ethane, 2,2-bis[4-(3-aminophenoxy)phenyl]propane, 2,2-bis[4-(4-aminophenoxy)phenyl]propane, 2,2-bis[4-(3-aminophenoxy)phenyl]butane, 2,2-bis[3-(3-aminophenoxy)phenyl]-1, 1,1,3,3,3-hexafluoropropane, 2,2-bis[4-(4-aminophenoxy) phenyl]-1,1,1,3,3,3-hexafluoropropane, 1,3-bis(3-aminophenoxy)benzene, 1,4-bis(3-aminophenoxy)benzene, 1,4'-bis(4-aminophenoxy)benzene, 4,4'-bis(4-aminophenoxy)biphenyl, bis[4-(3-aminophenoxy)phenyl]ketone, bis [4-(4-aminophenoxy)phenyl]ketone, bis[4-(3-aminophenoxy)phenyl]sulfide, bis[4-(4-aminophenoxy)phenyl] sulfide, bis[4-(3-aminophenoxy)phenyl]sulfone, bis[4-(4-aminophenoxy)phenyl]sulfone, bis[4-(3-aminophenoxy) phenyl]ether, bis[4-(4-aminophenoxy)phenyl]ether, 1,4-bis [4-(3-aminophenoxy)benzoyl]benzene, 1,3-bis[4-(3-aminophenoxy)benzoyl]benzene, 4,4'-bis[3-(4-aminophenoxy)benzoyl]diphenyl ether, 4,4'-bis[3-(3-aminophenoxy)benzoyl]diphenyl ether, 4,4'-bis[4-(4-amino-α,α-dimethylbenzyl)phenoxy]benzophenone, 4,4'-bis[4-(4-amino-α, α-dimethylbenzyl)phenoxy]diphenyl sulfone, bis [4-{4-(4-aminophenoxy)phenoxy}phenyl]sulfone, 1,4-bis [4-(4-aminophenoxy)-α,α-dimethylbenzyl]benzene and 1,3-bis[4-(4-aminophenoxy)-α,α-dimethylbenzyl]benzene.

Furthermore, among the diamines represented by the formula (3), the diamine compounds having an amino group at meta position, that is, the diamine compounds represented by the formula (5), are preferably used because these are capable of providing a thermoplastic polyimide resin having a solubility superior to that brought about by the diamine having an amino group at para position.

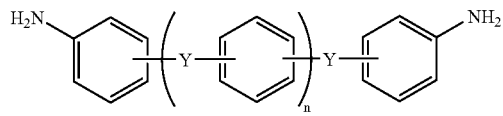

(5)

In the formula Y represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond; and each of a and b are independently an integer of at least 0 to at most 5.

Examples of the diamines represented by the formula (5) are 1,1-bis[4-(3-aminophenoxy)phenyl]ethane, 1,2-bis[4-(3-aminophenoxy)phenyl]ethane, 2,2-bis[4-(3-aminophenoxy) phenyl]propane, 2,2-bis[4-(3-aminophenoxy)phenyl]butane, 2,2-bis[3-(3-aminophenoxy)phenyl]-1,1,1,3,3,3-hexafluoropropane, 1,3-bis(3-aminophenoxy)benzene, 1,4-bis(3-aminophenoxy)benzene, bis[4-(3-aminophenoxy) phenyl]ketone, bis[4-(3-aminophenoxy)phenyl]sulfide, bis [4-(3-aminophenoxy)phenyl]sulfone, bis[4-(3-aminophenoxy)phenyl]ether, 1,4-bis[4-(3-aminophenoxy) benzoyl]benzene, 1,3-bis[4-(3-aminophenoxy)benzoyl] benzene and 4,4'-bis[3-(3-aminophenoxy)benzoyl]diphenyl ether.

Among the above-mentioned diamines, using 1,3-bis(3-aminophenoxy)benzene is particularly preferable from the viewpoint of providing a polyimide resin having superior solubility in various organic solvents, excellent soldering heat resistance and PCT resistance.

As described above, when diamine having an amino group at meta position is used, the effect of improving the solubility of the polyimide resin of the present invention can be expected and the amount of the diamine is preferably 50 to 100% by mole, more preferably 80 to 100% by mole based on the total diamine component.

Also it is preferable that the above-mentioned component (A) is a polyimide resin obtained by using the diamine represented by the formula (4). As the diamine represented by the formula (4), 3,3'-dihydroxy-4,4'-diaminobiphenyl represented by the following formula is preferable:

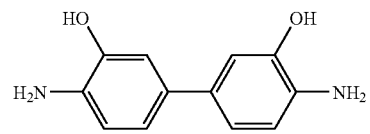

Since a hydroxyl group is introduced into the polyimide resin when this diamine is used, the polyimide resin can react with a compound having a group capable of reacting with a hydroxyl group. Therefore, when a resin having a group capable of reacting with hydroxyl group is used as the component (B) mentioned below, cross-linking advances and a resin composition having further improved heat resistance, soldering heat resistance and PCT resistance can be obtained.

When preparing the above-mentioned component (A), it is preferable to use the above-mentioned acid dianhydride (a) and 3,3'-dihydroxy-4,4'-diaminobiphenyl in combination from the viewpoint of soldering heat resistance and PCT resistance, and it is preferable that the diamine component contains 1 to 99% by mole of diamine (b) represented by the formula (3) and 99 to 1% by mole of 3,3'-dihydroxy-4,4'-diaminobiphenyl from the viewpoint of well-balanced solubility and crosslinking density.

Also the diamine having reactivity, which is represented by the formula (4), may also be preferably used:

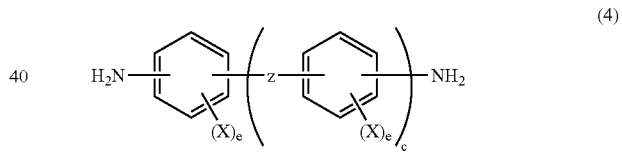

(4)

wherein Z represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond; each of b and c is independently an integer of at least 0 to at most 5; X independently represents one or at least two kinds of functional group selected from the group consisting of —OH, —COOH, —OCN and —CN; and e is an integer of 1 to 4.

In the formula (4), b is preferably an integer of at least 1 to at most 5. Also c is preferably an integer of at least 1 to at most 5.

These diamines represented by the formula (4) may be used alone or in combination of two or more. In the formula (4), a functional group which is bonded to a benzene ring and has reactivity is the essential component and in addition to this, a hydrocarbon group such as methyl group and ethyl group and a halogen group such as Br and Cl may also be introduced.

Examples of the above-mentioned diamines having reactivity are 3,3'-dihydroxy-4,4'-diaminobiphenyl and 3,5-diaminobenzoate. Since a hydroxyl group is introduced into the polyimide resin obtained by using, for example, 3,3'- dihydroxy-4,4'-diaminobiphenyl, the polyimide resin has reactivity with epoxy compound and cyanato ester compounds which are thermosetting resins. Therefore, the resin composition of the present invention, which contains a polyimide resin and thermosetting resin, allows cross-linking to progress, making it possible to provide an adhesive superior in heat resistance and PCT resistance. Since too much amount of diamine having reactivity might impair solubility of the resulting polyimide resin, the amount of the diamine represented by the formula (4) is preferably 0 to 50% by mole, more preferably 0 to 20 by mole based on the diamine component.

After obtaining a polyimide resin by allowing a diamine component having a hydroxyl group to react with an acid dianhydride, the hydroxyl group in the side chain of polyimide may be allowed to react with, for example, cyan bromide to form a cyanate ester modified polyimide resin with a modified cyanate ester group, thereby imparting reactivity.

Other applicable diamine components are m-phenylenediamine, o-phenylenediamine, p-phenylenediamine, m-aminobenzylamine, p-aminobenzylamine, bis(3-aminophenyl)sulfide, (3-aminophenyl)(4-aminophenyl)sulfide, bis(4-aminophenyl)sulfide, bis(3-aminophenyl)sulfoxide, (3-aminophenyl)(4-aminophenyl)sulfoxide, bis(3-aminophenyl)sulfone, (3-aminophenyl)(4-aminophenyl)sulfone, bis(4-aminophenyl)sulfone, 3,4'-diaminobenzophenone, 4,4'-diaminobenzophenone, 3,3'-diaminodiphenylmethane, 3,4'-diaminodiphenylmethane, 4,4'-diaminodiphenylmethane, 4,4'-diaminodiphenyl ether, 3,3'-diaminodiphenyl ether, 3,4'-diaminodiphenyl ether, bis[4-(3-aminophenoxy)phenyl]sulfoxide and bis[4-(aminophenoxy)phenyl]sulfoxide, but the diamine components are not limited by these.

The above-mentioned component (A) is obtained by subjecting the corresponding precursor polyamide acid polymer to dehydration and ring closing. The polyamide acid polymer is obtained by allowing practically equimolecular amounts of acid dianhydride component to react with diamine component.

As a typical sequence of the reaction, the method of dissolving or dispersing at least one diamine component in an organic polar solvent and then adding at least one acid dianhydride components to obtain a polyamide acid solution can be given. The order of adding each monomer is not particularly limited. To obtain the solution of polyamide acid polymer, the acid dianhydride component may first be added to the organic polar solvent, then the diamine component is added, or an appropriate amount of the diamine component may first be added to the organic polar solvent, followed by adding an excessive amount of the acid dianhydride component, then the diamine component is added in an amount equivalent to the excess amount. There are also other methods known to a person skilled in the art. Herein, besides cases in which the solvent completely dissolves the solute, "dissolve" includes cases in which the solute is evenly dispersed or diffused within the solvent and is in practically in the same state as being dissolved. The reaction time and the reaction temperature are not particularly limited.

Examples of the organic polar solvent used in the polymerization reaction for obtaining polyamide acid are sulfoxide solvents such as dimethyl sulfoxide and diethyl sulfoxide, formamide solvents such as N,N-dimethylformamide and N,N-diethylformamide, acetamide solvents such as N,N-dimethylacetamide and N,N-diethylacetamide, pyrrolidone solvents such as N-methyl-2-pyrrolidone and N-vinyl-2-pyrrolidone, and phenol solvents such as phenol, o-, m- or p-cresol, xylenol, halogenated phenol and catechol, or hexamethyl phosphoramide, γ-butyrolactone, etc. Moreover, if necessary, these organic polar solvents may be used in combination with aromatic hydrocarbon such as xylene or toluene.

The polyamide acid solution obtained in the above method is subjected to dehydration and ring closing by a thermal or chemical method to prepare polyimide and both the thermal method of dehydrating the polyamide acid solution by heat-treating and the chemical method of dehydrating by using a dehydrating agent may be used. The method of imidizing by heating under a reduced pressure may also be used. The following description will discuss the respective methods.

As the method of dehydrating and ring closing thermally, the method of advancing imidization reaction by heat-treating the above-mentioned polyamide acid solution while evaporating the solvent can be given. According to this method, a solid polyimide resin can be prepared. Although not particularly limited, the heating process is preferably carried out in a range of approximately 5 minutes to 200 minutes at a temperature of at most 300° C.

As the method of dehydrating and ring closing chemically, the method of adding a stoichiometrically excess amount of dehydrating agent and catalyst to the above-mentioned polyamide acid solution, thereby exerting dehydration reaction and evaporating the organic solvent can be given. According to this method, a solid polyimide resin can be prepared. Examples of the dehydrating agent are aliphatic anhydrides such as acetic anhydride and aromatic anhydrides such as benzoic anhydride. Examples of the catalyst are aliphatic tertiary amines such as triethyl amine, aromatic tertiary amines such as dimethyl aniline and heterocyclic tertiary amines such as pyridine, α-picoline, β-picoline, γ-picoline and isoquinoline. With respect to the conditions of chemical dehydration and ring closing, the temperature is preferably at most 100° C. and the evaporation of the organic solvent is preferably carried out in a range of approximately 5 minutes to 120 minutes at a temperature of at most 200° C.

Another method of preparing polyimide resin is the method that in the above-mentioned thermal or chemical dehydrating and ring closing method, the solvent is not evaporated. More specifically, it is the method of obtaining solid polyimide resin, which comprises adding, to a poor solvent, a polyimide resin solution obtained by thermal imidization treatment or chemical imidization treatment using a dehydration agent to precipitate the polyimide resin, removing unreacted monomers, and then refining and drying. As the poor solvent, one which mixes well with a solvent but to which polyimide is not easily dissolved should be selected. Examples include acetone, methanol, ethanol, isopropanol, benzene, methyl cellosolve and methyl ethyl ketone, but the poor solvent is not limited to these examples.

Next, the method of imidizing by heating under a reduced pressure is explained. By this imidizing method, because the water generated by imidization can be actively removed from the system, hydrolysis of the polyamide acid can be controlled and polyimide of a high molecular weight is obtained. Furthermore, by this method, the ring opening on one or both sides of the element which is present as impurity within the acid dianhydride material closes again and so further effect of increasing the molecular weight can be expected.

As for the heating conditions for the method of imidizing by heating under reduced pressure, the heating temperature is preferably 80° to 400° C., more preferably at least 100° C. and most preferably at least 120° C. as imidization is conducted efficiently and water is removed efficiently. The highest temperature is preferably at most the thermal decomposition temperature of the polyimide to be obtained and the completion temperature of usual imidization, that is approximately 250° to 350° C., is usually adopted.

Regarding the conditions of reduced pressure, the smaller the pressure, the better. Specifically, the pressure is at most $9\times10^4$ to $1\times10^2$ Pa, more preferably $8\times10^4$ to $1\times10^2$ Pa, most preferably $7\times10^4$ to $1\times10^2$ Pa.

The polyimide resin obtained as described above has a glass transition temperature in a comparatively low area and in order to impart a particularly superior processability to the resin composition of the present invention, the glass transition temperature of the polyimide resin is preferably at most 350° C., more preferably at most 320° C., most preferably at most 280° C. When the glass transition temperature of the polyimide resin exceeds 350° C., processing at high temperature may be required in the laminating step when preparing a printed wiring board.

The following description will discuss the thermosetting resin (B). The effect of improving adhesion property can be obtained by adding an appropriate amount of thermosetting resin to the polyimide resin. In addition, appropriate resin flowability, in other words excellent processability, can also be imparted. Here, the appropriate resin flowability is explained. The polyimide resin sheet and the polyimide resin sheet with metal foil of the present invention are made from a polyimide composition containing a polyimide resin and a thermosetting resin, and maintain a semi-cured state. The appropriate resin flowability refers to such a state that the resin composition of the present invention melts and flows in a moderate manner when laminating the polyimide resin sheet or the polyimide resin sheet with metal foil of the present invention on an inner layer plate having a circuit by the heat pressing method.

Examples of the component (B) are bismaleimide resin, bisallylnadimide resin, phenol resin, cyanate resin, epoxy resin, acrylic resin, methacrylic resin, triazine resin, hydrosilyl cured resin, allyl cured resin and unsaturated polyester resin. These may be used alone or in combination if necessary.

Besides the above-mentioned thermosetting resins, thermosetting polymer containing a reactive group such as an epoxy group, an allyl group, a vinyl group, an alkoxysilyl group and a hydrosilyl group in the side chain may be used as a thermosetting component.

Among the above-mentioned thermosetting resins, epoxy resins and cyanate resins are preferable from the viewpoint of providing a well-balanced resin composition. Among these, epoxy resins are more preferably used from the viewpoint of high adhesive property, superior low temperature processability and being able to improve the heat resistance and soldering heat resistance.

In the followings the epoxy resin is explained. In the present invention, any epoxy resin may be used as the epoxy resin. Examples thereof include bisphenol epoxy resins, halogenated bisphenol epoxy resins, phenol novolak epoxy resins, halogenated phenol novolak epoxy resins, alkyl phenol novolak epoxy resins, polyphenol epoxy resins, polyglycol epoxy resins, cyclic aliphatic epoxy resins, cresol novolak epoxy resins, glycidyl amine epoxy resins, urethane modified epoxy resins, rubber modified epoxy resins and epoxy modified polysiloxane.

Next the cyanate resin is explained. In the present invention any cyanate resin may be used as the cyanate resin. Examples thereof include 2,2'-dicyanatediphenyl methane, 2,4'-dicyanatediphenyl methane, 4,4'-dicyanatediphenyl methane, bis(3-methyl-4-cyanatephenyl)methane, bis(3,5-dimethyl-4-cyanatephenyl)methane, bis(3,5-dibromo-4-cyanatephenyl)methane, bis(3,5-dichloro-4-cyanatephenyl) methane, 2,2-bis(4-cyanatephenyl)propane, 2,2-bis(3,5-dimethyl-4-cyanatephenyl)propane, 2,2-bis(3-methyl-4-cyanatephenyl)propane, 4,4'-dicyanatediphenyl ether, 4,4'-dicyanatediphenylthioether, 2,2-bis(4-cyanatephenyl) perfluoropropane, 1,1-bis(4-cyanatephenyl)ethane, 2,2-bis (3,5-dichloro-4-cyanatephenyl)propane and 2,2-bis(3,5-dibromo-4-cyanatephenyl)propane. Among these, 4,4'-dicyanatediphenyl methane, 2,2-bis(4-cyanatephenyl) propane, bis(3,5-dimethyl-4-cyanatephenyl)methane, 4,4'-dicyanatediphenylthioether, 2,2-bis(4-cyanatephenyl) perfluoropropane, 1,1-bis(4-cyanatephenyl)ethane and 2,2-bis(3,5-dibromo-4-cyanatephenyl)propane are preferably used. More preferably, 4,4'-dicyanatediphenyl methane and 2,2-bis(3,5-dibromo-4-cyanatephenyl)propane are used.

A curing catalyst may be preferably used, but this is not necessarily required. As the curing catalyst, imidazoles, tertiary amines, organic metal compounds and the like are used. Among these, organic metal compounds are preferably used, and examples thereof include cobalt octylate, zinc octylate, cobalt naphthenate and zinc naphthenate. Moreover, in order to accelerate the curing reaction, non-volatile phenols may be preferably used in combination, and examples thereof include various bisphenols such as bisphenol A, bisphenol F and bisphenol S, and nonylphenol.

The mixing ratio of the above-mentioned component (B) is preferably at least 1 part by weight, more preferably at least 5 parts by weight based on 100 parts by weight of the above-mentioned component (A). When the mixing ratio of the component (B) is too small, the adhesion strength may be decreased and reduction of resin flowability tends to occur. The mixing ratio of the above-mentioned component (B) is preferably at most 10,000 parts by weight, more preferably at most 2,000 parts by weight, further preferably 70 parts by weight, most preferably 60 parts by weight. When the mixing ratio of the (B) component is too large, flexibility or heat resistance may be lowered. When high elasticity is required for the polyimide resin composition at high temperature, in other words properties of thermosetting resin is required, the mixing ratio of the component (B) is preferably 100 to 2,000 parts by weight based on 100 parts by weight of the above-mentioned component (A). When flexibility is required for the polyimide resin composition, in other words, properties of thermoplastic resin is required, the mixing ratio of the component (B) is preferably 5 to 100 parts by weight.

The polyimide resin and the polyimide resin composition containing a thermosetting resin according to the present invention have a high electrical insulating property. In recent years, though thinning of the circuit width and space of the printed wiring board is in progress, the conventional materials which have small insulating resistance have failed to provide a sufficient insulating property. However, the polyimide resin composition of the present invention provides a high insulating resistance and in a preferred embodiment, the volume resistance is at least $5\times10^{12}$ Ωcm and in a more preferred embodiment the volume resistance is at least $5\times10^{16}$ Ωcm. Here, the measurement was carried out in accordance with ASTM D-257. Moreover, the polyimide resin composition of the present invention has a low dielectric constant and a low dielectric loss tangent. Recently, along with an increase in the clock frequency in the semiconductors, reducing signal delay and transmission loss, that is, low dielectric constant and low dielectric loss tangent in a GHz band are required for the wiring board materials. In a preferred embodiment, the specific dielectric constant is at most 3.5 and the dielectric loss tangent is at most 0.015, and in a more preferred embodiment the specific dielectric constant is at most 3.0 and the dielectric loss tangent is at most 0.010.

In a preferred embodiment, the resin composition of the present invention contains at least one kind of solvent. The solvent is not particularly limited as long as it dissolves polyimide resin and epoxy resin. However the type and amount of the solvent should be determined considering that the amount of the remnant volatile component in the polyimide resin can be reduced to at most 10% by weight, more preferably at most 7% by weight. It is also necessary to adjust the temperature and time appropriately when drying. When the amount of remnant volatile component is greater than 10% by weight, foaming tends to occur in the step which involves heating in the process for preparing a printed wiring board or in the step of soldering reflow when assembling the parts on the prepared printed wiring boards, and this is not preferable. From the viewpoint of economical efficiency and workability, solvents having a boiling point of at most 160° C. are preferably used. Further, solvents having a boiling point of at most 130° C. are more preferably used, and solvents having a boiling point of at most 105° C. are most preferably used. Examples of such low-boiling point solvents are tetrahydrofran (hereinafter THF: boiling point 66° C.), 1,4-dioxane (hereinafter dioxane: boiling point 103° C.), monoglyme (boiling point 84° C.), dioxolane (boiling point 76° C.) and dimethoxyethane (boiling point 85° C.). These may be used alone or in combination of two or more.

In the present invention, by using the above-mentioned component (A) as a constituent component, a superior adhesive capable of adhering in low temperature with low water absorption can be obtained.

When a polyimide resin obtained by using 3,3'-dihydroxy-4,4'-diaminobiphenyl is used as component (A) and an epoxy resin is used as component (B), a resin composition having superior PCT resistance with a high retaining ratio of peeling strength after the PCT which is the reliability test for electronic materials can be prepared, because the hydroxyl group present in the component (A) reacts with the epoxy resin and thus the cross-linking reaction advances.

Furthermore, an epoxy curing agent, accelerator and various coupling agents which are generally used for acid dianhydride materials such as acid anhydrides, amine and imidazole materials, may be used together according to the need of water absorption, soldering heat resistance, heat resistance and adhesive property. Also thermosetting resins other than epoxy resins, phenol resins and cyanate resins may be used together.

Conventional polyimide adhesives have failed to provide a sufficient adhesive property with metal such as copper foil and resin films such as polyimide resins. In addition mixing the polyimide adhesive with an epoxy resin is difficult because of the low solubility of the polyimide adhesive. However, the resin composition used in the present invention makes it possible to provide a superior adhesive property with metal foil such as copper foil and polyimide films. Further, the resin composition of the present invention has good solubility in solvents. Since the resin composition for adhesive of the present invention has a superior solubility in organic solvents, processability is excellent when using the composition. For example, the solution of polyimide resin obtained by imidizing the polyamide acid polymer and epoxy resin may be used directly in the form of a sheet or varnish, or may be used as varnish obtained by making the solution of the polyimide resin and the epoxy resin into solid and then dissolving in an organic solvent.

Regarding the embodiment of using the resin composition for adhesive of the present invention, those which can be carried out by the person skilled in the art can be employed. In particular, since the composition is superior in handling property and highly applicable industrially, the composition can be used as an adhesive in the form of a sheet by forming into a sheet previously. Moreover, the resin composition of the present invention can be impregnated into a glass cloth, glass mat, aromatic polyamide fiber cloth or aromatic polyamide fiber mat as varnish, then semi-cured to be used as a sheet-type fiber reinforcing adhesive.

Furthermore, the resin composition of the present invention can be used as varnish by dissolving in a solvent. More specifically, after varnish obtained by dissolving the resin composition in an organic solvent is applied on one or both of the surfaces of a polyimide film and dried, metal foil such as copper foil, aluminum foil and 42 alloy foil, a polyimide film or a printed circuit board may be laminated by heating and pressing. Here, the types of the polyimide film are not particularly limited. The organic solvent is not particularly limited, but the organic polar solvent used in the generation reaction of a polyamide acid solution is preferable. Examples thereof are sulfoxide solvents such as dimethyl sulfoxide and diethyl sulfoxide, formamide solvents such as N,N-dimethylformamide and N,N-diethylformamide, acetamide solvents such as N,N-dimethylacetamide and N,N-diethylacetamide, pyrrolidone solvents such as N-methyl-2-pyrrolidone, and phenol solvents such as phenol, o-, m- or p-cresol, xylenol, halogenated phenol and catechol, or hexamethylphosphoramide, γ-butyrolactone, etc. These organic polar solvents may be used in combination with aromatic hydrocarbon such as xylene or toluene according to need, but the organic solvent is not limited to these.

With respect to adhering conditions of the composition for an adhesive of the present invention, any conditions may be applied as long as sufficient adhesion and curing are attained. More specifically, the heating temperature is preferably 150° C. to 250° C. The pressure is preferably 0.1 to 10 MPa and the heating time is preferably approximately 5 to 20 minutes.

The resin composition of the present invention has properties suitable for electronic devices such as flexible printed circuit boards, TAB tapes and laminating materials. In other words, the resin composition is superior in heat resistance such as soldering heat resistance, exhibits a high retaining ratio of peeling strength after the PCT of preferably at least 60%, more preferably at least 70%, because crosslinking is promoted by the reaction between the hydroxyl group of the polyimide resin and the epoxy resin and in addition, has excellent adhesion. Also when used as an adhesive, adhesion can be carried out at a comparatively low temperature of at most about 250° C.

The polyimide resin sheet or the polyimide resin sheet with metal foil of the present invention is obtained by dissolving the polyimide resin composition containing a polyimide resin and a thermosetting resin of the present invention using at least one solvent to form a polyimide resin composition solution, then applying the resulting solution to a support or metal foil by using a known coating method such as die coating method, knife coating method or a gravure coating method, and drying at a temperature at which the curing reaction does not progress extremely.

The type of the support is not particularly limited as long as it has sufficient heat resistance required in coating and drying steps and a sufficient mold-releasing property when preparing a printed wiring board. A synthetic resin film which is economically efficient to use is preferable considering that the support is removed and disposed when preparing a printing wiring board. Examples thereof are a polyethylene terephthalate film, a polyethylene naphthalate film and polyphenylene sulfur film. Among these, polyethylene terephthalate film is preferably used as the cost is low and the quality is stable. When a high heat resistance is required, polyethylene naphthalate film is also preferably used.

The support is peeled before the laminating step in the process of preparing a printed wiring board, and thus a surface shape corresponding to the surface roughness of the support is copied on the surface of the peeled polyimide resin sheet. When preparing a printed wiring board by using the polyimide resin sheet of the present invention, the laminate is obtained by laminating by a method which involves heating and/or pressing, while inserting the polyimide resin sheet of the present invention between the circuit face of an inner layer wiring board having a circuit pattern and the roughened surface of metal foil, and curing. At this time, the polyimide resin sheet should be embedded in the roughened surface of the metal foil without entrapping bubbles so that sufficient adhesion strength, high insulating reliability and superior reflow resistance in packaging are exhibited. For this purpose, it is preferable that the polyimide resin sheet before lamination has a smooth surface, in other words, the support has a smooth surface. Specifically, the surface roughness Rz of the support is preferably at most 1 μm, more preferably the at most 0.5 μm.

In order to prevent surface contamination and scratches, a protective film may be formed on the polyimide resin sheet of the present invention.

A printed wiring board can be prepared by using the above-mentioned laminate obtained by using the polyimide resin sheet of the present invention by forming circuit according to the subtractive process or semi-additive process.

In the polyimide resin sheet with metal foil, a metal having a low electrical resistance is preferably used because the metal foil may be used as one portion of the circuit of the printed wiring board. Examples of the metal foil are copper foil, aluminum foil and nickel foil. Among these, copper foil which is generally used for preparing printed wiring boards is preferable. The polyimide resin composition is preferably formed on the roughened surface of the metal foil in order to provide a high adhesive property. When the metal foil is used as a part of the circuit of the printed wiring board, it is necessary that the metal foil is firmly adhered to the polyimide resin composition after curing. In this point, the polyimide resin composition of the present invention has sufficient adhesion strength to the metal foil with roughened surface. Here, the sufficient adhesion strength refers to a strength of at least 7 N/cm, more preferably 10 N/cm.

The polyimide resin sheet with metal foil of the present invention is preferably used in the semi-additive process. In the semi-additive process in the process for preparing a printed wiring board of the present invention, the polyimide resin composition surface of the polyimide resin sheet with metal foil of the present invention is faced with the circuit face of the inner layer wiring board having a circuit pattern, and lamination is carried out by a method which involves heating and/or pressing to cure. After removing the metal foil of the obtained laminate by etching or the like, via holes are made by using a laser. Then chemical plating is carried out on the surface of the polyimide resin sheet from which the metal foil has been removed by etching, followed by formation of plating resist, pattern plating by electroplating and resist peeling. Finally by quick-etching the chemically plated layer which is the feeding layer a circuit is formed. In this case, the roughened surface shape of the metal foil has been copied on the surface of the polyimide resin sheet from which the metal foil is removed by etching or the like. In the chemical plating, adhesion strength is exhibited because of the anchor effect of the copied roughened surface shape. In order to obtain high adhesion strength, increasing the surface roughness of the metal foil, in other words, using a metal foil with roughened surface of a high surface roughness is effective. However, as described above, when the surface roughness Rz is 3 to 5 μm and the line width of the circuit to be formed is 30/30 μm or less, in particular 25/25 μm or less, it is difficult to create an excellent circuit because of the unevenness of the surface, although there is no problem when the line/space of the circuit to be formed is 30/30 μm or more. Therefore, when the surface roughness of the metal foil surface of the polyimide resin sheet of the present invention is small, it is an advantage in forming microcircuit and at the same time, excellent adhesion is required. In order to provide excellent adhesion strength and microcircuit, the surface roughness Rz of the metal foil is preferably at most 3 μm, more preferably at most 2 μm, most preferably at most 1 μm. Here, the surface roughness of the metal foil is preferably at most 0.1 times the width of the circuit to be formed from the viewpoint of obtaining an excellent circuit shape. As the copper foil, electrolytic copper foil and rolled copper foil are available, and the rolled copper foil is more preferably used as the rolled copper foil having a smaller surface roughness is readily available.

The resin composition of the present invention can be firmly adhered to chemical plating even when the surface roughness of the plating is at most 3 μm. In other words, the resin composition of the present invention made it possible to provide both excellent adhesive property and microcircuit formation. Moreover, in the case of smaller surface roughness, the feeding electrode can be removed in a shorter period of time in the etching process of the semi-additive process as compared with the case of greater surface roughness, and this is an advantage in microcircuit formation. In other words, since the etching is completed soon, the etching amount of the circuit pattern formed by electroplating becomes smaller and the circuit width and thickness remains as planned and consequently, this is an advantage in microcircuit formation.

The polyimide resin sheet and the polyimide resin sheet with metal foil of the present invention have high insulating resistance and excellent adhesion strength, attain microcircuit formation and thus useful as a material for printed wiring boards and build-up wiring boards having fine wiring.

Rz is defined in JIS B0601 which describes the standard of surface shape. The sensing pin type surface roughness meter of JIS B0651 or the lightwave interfering type surface roughness meter of JIS B0652 may be used to measure Rz. In the present invention, the ten point average roughness of the polymer film is measured using the lightwave interfering type surface roughness meter New View 5030 System made by ZYGO Co.

The following description will discuss the laminating step in the process for preparing a printed wiring board of the present invention. The polyimide resin composition surface of the polyimide resin sheet or the polyimide resin sheet with metal foil of the present invention is faced with the inner layer wiring board having a circuit and lamination is carried out by the method which involves heating and/or pressing. When laminating, hydraulic press, vacuum press and vacuum lamination can be applied. The vacuum press and vacuum lamination are preferably used from the viewpoint of preventing foam to be included when laminating, in view of a better embedding property of the inner layer circuit and preventing metal oxidation caused by heating of the metal layer and adhesive layer of the laminate of the present invention. The maximum lamination temperature is preferably at most 300° C., more preferably at most 250° C., most preferably at most 200° C. The lamination time is preferably about 1 minute to 3 hours, more preferably 1 minute to 2 hours. In the case of vacuum press and vacuum lamination, the inner pressure of the chamber is preferably at most 10 kPa, more preferably at most 1 kPa.

After laminating, the resulting product may be placed in a curing oven such as hot-air oven. The thermosetting reaction of the polyimide resin composition can be promoted in the curing oven and in particular, when the lamination time is shortened, preferably to 20 minutes, putting the resulting product in the curing oven is preferable because productivity can be improved. Furthermore, when preparing a printed wiring board by the semi-additive process, from the viewpoint of improved productivity, setting the lamination time to at most 20 minutes, removing the whole copper foil and then advancing the thermosetting reaction in the curing oven at the stage in which the curing reaction of the polyimide resin composition is not completely finished can also be applied. This method is preferable because the curing reaction can be carried out in the curing oven without foaming even if the amount of residual solvent in the polyimide resin composition is great.

When laminating using the polyimide resin sheet of the present invention, metal foil is used. Although the kind of metal foil is not particularly limited, a metal foil having a low electrical resistance is preferable because the metal foil may be used as a part of the circuit of the printed wiring board. More specifically, copper foil, aluminum foil, nickel foil and the like are preferably used, and copper foil, which is generally used in the printed wiring board production, is preferably used. The surface shape of this metal foil is copied on the polyimide resin surface which is exposed by etching of the whole metal foil after the lamination and chemical plating is carried out on the polyimide resin surface. As described above, in order to provide an excellent adhesion strength and microcircuit, the surface roughness Rz of the metal foil is preferably at most 3 μm, more preferably at most 2 μm, most preferably at most 1 μm. Here, the surface roughness is preferably at most 0.1 times the width of the circuit to be formed from the viewpoint of obtaining an excellent circuit shape. As the copper foil, electrolytic copper foil and rolled copper foil are available, and the rolled copper foil is more preferably used because the rolled copper foil has a smaller surface roughness In the process for preparing a printed wiring board of the present invention, after the lamination step, drilling is carried out from the polyimide resin surface from which the whole metal foil has been peeled by etching through the electrode of the inner layer wiring board. In the etching of metal foil, an etchant suitable for the metal foil is preferably used. In the case of copper foil, aluminum foil and nickel foil which are listed as preferable metal foil, generally available ferric chloride etchant and cupric chloride etchant can be preferably used.

With respect to the drilling method, known drill machines, dry plasma devices, carbon dioxide laser, UV laser, excima laser and the like may be used, and UV-YAG laser and excima laser are preferable because via holes of a small diameter of at most 50 μm, in particular, at most 30 μm can be formed with maintaining excellent hole shape. Needless to say, panel plating may be conducted by chemical plating after forming through holes by using a drill machine. In addition, desmearing according to a known method can also be carried out after drilling.

Examples of the chemical plating used in the process for preparing a printed wiring board of the present invention are electroless copper plating, electroless nickel plating, electroless gold plating, electroless silver plating and electroless tin plating, but from an industrial viewpoint and the viewpoint of electric properties such as metal migration resistance, electroless copper plating and electroless nickel plating are preferable, particularly electroless copper plating.

In the chemical plating, a plating coating is to be formed on the inner face of the via hole and/or through hole formed by laser drilling to provide a feeding electrode. Therefore, the thickness of chemical plating in the process for preparing a printed wiring board of the present invention is preferably in a range of 100 nm to 1,000 nm, more preferably 200 nm to 800 nm. When the thickness is smaller than 100 nm, the thickness of the in-plane electroplating tends to vary as the chemical plating functions as the feeding electrode. On the other hand when the thickness exceeds 1,000 nm, extra etching needs to be carried out in the etching step of the process for preparing a printed wiring board of the present invention, thus the circuit thickness becomes thinner than the planned circuit value and the circuit width becomes narrow. Furthermore, problems may arise, such as undercut occurring and circuit shape deteriorating.

With respect to the photosensitive plating resist to be used in the process for preparing a printed wiring board of the present invention, known materials which are generally available in the market may be used. In the process of the present invention, in order to correspond to the narrowing of pitches, a photosensitive plating resist having a resolution of at most 50 μm is preferably used. Naturally, regarding the wiring pitch of the printed wiring board prepared according to the process of the present invention, a circuit having a pitch of at most 50 μm and a circuit having a pitch greater than this may exist in combination.

As for the electroplating employed in the process for preparing a printed wiring board of the present invention, various known methods may be adopted. Specifically, copper electroplating, solder electroplating, tin electroplating, nickel electroplating, and gold electroplating can be given. From an industrial viewpoint and the viewpoint of electric properties such as metal migration resistance, copper electroplating and nickel electroplating are preferable, particularly copper electroplating.

In the step of removing the chemical plating layer in the process for preparing a printed wiring board of the present invention, a known quick etchant may be used. For example, sulfuric acid/hydrogen peroxide etchant, ammonium persulfate etchant, sodium persulfate etchant, diluted ferric chloride etchant and diluted cupric chloride etchant can be preferable used.

When a circuit pattern of a line/space of 15 μm/15 μm was prepared according to the process for preparing a printed wiring board of the present invention, the obtained circuit width was 14.7 μm after etching, compared to 15.0 μm before etching, and the shape was almost as planned.

As described above, in the process for preparing a printed wiring board of the present invention, an excellent microcircuit pattern can be formed on the fine surface irregularities of the polyimide resin composition of the present invention and high adhesion strength is attained. In addition, because the feeding layer on the fine surface irregularities can be etched efficiently without etching remnant and because the polyimide resin composition of the present invention has high insulating resistance, it is possible to provide high insulating property required for the microcircuit space which will be further narrowed in the future. Also, the polyimide resin sheet and the polyimide resin sheet with metal foil of the present invention are preferably used for the printed wiring board and the process for preparing the same of the present invention.

In the following the present invention is explained in detail based on Examples but these examples are used only for explanation and the present invention is not limited thereto. It will be obvious that the same may be varied in many ways, and all such modifications as would be obvious to one skilled in the art are not to be regarded as a departure from the spirit and scope of the invention.

The glass transition temperature was measured by using DMS 200 (made by Seiko Instruments Inc.).

EXAMPLE 1

A glass flask having a capacity of 2000 ml was charged with 0.95 equivalent of 1,3-bis(3-aminophenoxy)benzene (hereinafter APB) and 0.05 equivalent of 3,3'-dihydroxy-4,4'-diaminobiphenyl (available from Wakayama Seika Co., Ltd.) and stirring was carried out to dissolve under a nitrogen atmosphere. The solution in the flask was stirred while being cooled with ice water under the nitrogen atmosphere and 1 equivalent of 4,4'-(4,4'-isopropylidene diphenoxy)bisphthalic anhydride (hereinafter IPBP) was added thereto. Thus the polyamide acid polymer solution was obtained. The amount of DMF was determined so that the concentration of charged monomers, i.e. APB, 3,3'-hydroxy-4,4'-diaminobiphenyl and IPBP, becomes 30% by weight.

300 g of the polyamide acid solution was put in a teflon-coated tray, and heated under a reduced pressure in a vacuum oven under conditions of 200° C. and 665 Pa for 180 minutes to obtain 80 g of a thermoplastic polyimide resin having a hydroxyl group. The glass transition temperature of the obtained polyimide resin was 150° C.

The polyimide resin powder obtained by the above method, novolak type epoxy resin (Epicoat 1032H60: available from Yuka Shell Epoxy Co., Ltd.) and 4,4'-diaminodiphenyl sulfone (hereinafter 4,4'-DDS) which is a curing agent were dissolved in dioxolane respectively to prepare solutions, each having a concentration of 20% by weight. The obtained solutions were mixed so that the weight ratio of polyimide, epoxy resin and 4,4'-DDS was 70:30:9, and thus the adhesive solution was obtained.

The obtained adhesive solution was applied to both faces of a polyimide film (Apical 12.5 HP, available from Kaneka Corporation) respectively by using a gravure coater, and then dried at 170° C. for 2 minutes to form adhesive layers of a thickness of 5 μm.

The prepared polyimide film having an adhesive layer on both sides was heat-pressed and temporarily adhered to copper foil having a thickness of 5 μm at 200° C. under a pressure of 3 MPa for 5 minutes to obtain a laminate. The mat face of rolled copper foil of a thickness of 18 μm was heat-pressed to the adhesive layer applied on the reverse side of the laminate from the conductive layer, at a temperature of 200° C. under a pressure of 3 MPa for 60 minutes to cure the adhesive layer. The peeling strength between this copper foil and the laminate was 10.0 N/cm under normal conditions, 7.0 N/cm after PCT, and the retaining ratio after PCT was 70%. When the soldering heat-resistant test was carried out, neither swelling nor peeling was observed at 260° C.

EXAMPLE 2

To 500 g of polyamide acid solution obtained in the same manner as in Example 1 were added 35 g of β-picoline and 60 g of acetic anhydride, and the mixture was stirred for 1 hour and further stirred at 100° C. for 1 hour to imidize. Then the mixture was gradually added to methanol stirred at a high speed to obtain polyimide resin in the form of filament. After drying at 100° C. for 30 minutes, the resin was crushed by using a mixer, subjected to Soxhlet washing with methanol and then dried at 100° C. for 2 hours to obtain a polyimide powder. The obtained polyimide resin had a glass transition temperature of 150° C.

The peeling strength between the copper foil and the laminate was measured in the same manner as in Example 1 except that the polyimide resin powder obtained above was used. The peeling strength was 9.8 N/cm was under normal conditions, 6.9 N/cm after PCT and the retaining ratio after PCT was 70%. When the soldering heat-resistant test was carried out neither swelling nor peeling was observed at 260° C.

EXAMPLE 3

An adhesive solution was obtained in the same manner as in Example 1 except that polyimide, epoxy resin and 4,4'-DDS were mixed in a weight ratio of 50:50:15.

A laminate was obtained in the same manner as Example 1, and the peeling strength between the copper foil and the laminate was measured. The peeling strength was 8.7 N/cm under normal conditions, 6.0 N/cm after PCT, and the retaining ratio after PCT was 69%. When the soldering heat-resistant test was carried out, neither swelling nor peeling was observed at 260° C.

EXAMPLE 4

A thermoplastic polyimide resin was obtained in the same manner as in Example 1 except that 1 equivalent of 3,3'-bis (3-aminophenoxyphenyl)sulfone (hereinafter BAPS-M) was used instead of 0.95 equivalent of APB and 0.05 equivalent of 3,3'-dihydroxy-4,4'-diaminobiphenyl. The obtained polyimide resin had a glass transition temperature of 190° C. An adhesive solution was obtained in the same manner as in Example 1 except that the obtained polyimide resin, epoxy resin and 4,4'-DDS was mixed in a weight ratio of 70:30:9.

A laminate was obtained in the same manner as in Example 1 and the peeling strength between the copper foil and the laminate was measured. The peeling strength was 9.0 N/cm under normal conditions and 6.0 N/cm after PCT, and the retaining ratio after PCT was 67%. When the soldering heat-resistant test was carried out, neither swelling nor peeling was observed at 260° C.

EXAMPLE 5

A thermoplastic polyimide resin was prepared in the same manner as in Example 1 except that 0.8 equivalent of APB and 0.2 equivalent of 3,3'-dihydroxy-4,4'-diaminobiphenyl were used instead of 0.95 equivalent of APB and 0.05 equivalent of 3,3'-dihydroxy-4,4'-diaminobiphenyl. The obtained polyimide resin had a glass transition temperature of 160° C. An adhesive solution was obtained in the same manner as in Example 1 except that the obtained polyimide resin, epoxy resin and 4,4'-DDS was mixed in a weight ratio of 70:30:9.

A laminate was obtained in the same manner as in Example 1 and the peeling strength between the copper foil and the laminate was measured. The peeling strength was 8.2 N/cm under normal conditions and 5.7 N/cm after PCT, and the retaining ratio after PCT was 70%. When the soldering heat-resistant test was carried out, neither swelling nor peeling was observed at 260° C.

COMPARATIVE EXAMPLE 1

A polyimide resin powder was prepared in the same manner as in Example 1 except that pyromellitic dianhydride (PMDA) was used as the acid dianhydride component and oxydianiline (ODA) was used as the diamine component. The obtained polyimide resin had a glass transition temperature of 350° C. or more.

The polyimide resin powder did not dissolve in any of the solvents of DMF, THF, dioxane and dioxolane.

COMPARATIVE EXAMPLE 2

10 g of Platabond M1276 (copolymerized nylon, available from Nippon Rilsan Co. Ltd.), 20 g of Epicoat 1032H60 (Yuka Shell Epoxy Co., Ltd.) and 1 g of diaminodiphenyl sulfone was dissolved in 83 g of DMF. The obtained adhesive solution was applied to both faces of a polyimide film (Apical 12.5HP available from Kaneka Corporation) respectively by using a gravure coater, and then dried at 100° C. for 4 minutes to form adhesive layers of a thickness of 5 μm.

The prepared polyimide film having an adhesive layer on both sides was heat-pressed and temporarily adhered to copper foil having a thickness of 5 μm at 200° C. under a pressure of 3 MPa for 5 minutes to obtain a laminate. The mat face of rolled copper foil of a thickness of 18 μm was heat-pressed to the adhesive layer applied on the reverse side of the laminate from the conductive layer, at a temperature of 200° C. under a pressure of 3 MPa for 60 minutes to cure the adhesive layer. The peeling strength between this copper foil and the laminate was 8.0 N/cm under normal conditions, 2.0 N/cm after PCT, and the retaining ratio after PCT was 25%. When the soldering heat-resistant test was carried out, swelling and peeling were observed at 260° C.

The measurement of the peeling strength were carried out in accordance with JISC 6481. In the soldering heat-resisting test, swelling and peeling were visually observed and evaluated by subjecting the laminate to the environmental test at 40° C. in a humidity of 90% for 96 hours and then immersing in a solder bath at 260° C. for 10 seconds.

The condition of PCT (Pressure Cooker Test) which is the reliability test for electronics materials was set to a temperature of 121° C., a humidity of 100% and a time of 96 hours. The retaining ratio of the peeling strength after PCT was calculated based on the following equation in which F1 represents the peeling strength before PCT and F2 represents the peeling strength after PCT:

Retaining ratio (%) of peeling strength after $PCT$ $(\%)=F2+F1\times100$

EXAMPLE 6

(1) An adhesive solution was obtained in the same manner as in Example 1 except that the polyimide resin obtained in Example 4 was used and the weight ratio of the polyimide resin, epoxy resin and 4,4'-DDS were 90:10:3.

The obtained adhesive solution was applied to a polyethylene terephthalate film (surface roughness: 0.1 μm) having a thickness of 125 μm which is a support so that the thickness after a drying became 25 μm. Drying was carried out at 80° C. for 2 minutes, 120° C. for 2 minutes, 150° C. for 2 minutes and at 170° C. for 2 minutes to prepare a polyimide resin sheet.

A single-layer sheet obtained by peeling the support from the prepared polyimide resin sheet was inserted between the roughened surfaces of two sheets of copper foil (rolled copper foil BHY-22B-T available from Japan Energy Co. Ltd., Rz=1.97 μm), and curing was carried out at 200° C. for 2 hours to obtain a cured film. The adhesion strength of the rolled copper foil was 11 N/cm, the adhesion strength of the chemically plated copper to the roughened surface after etching the rolled copper foil was 8 N/cm. The insulating resistance was $1.7\times10^{16}$ Ωcm, and the specific dielectric constant was 3.1 and the dielectric loss tangent was 0.012. The dielectric property was evaluated by using a complex dielectric constant evaluation device using cavity resonator method with a perturbational theorum made by Kanto Denshi Oyo Kaihatsu Co., Ltd. in a range of 1 to 10 GHz.

(2) An inner layer circuit board was prepared from 9-μm-thick copper foil-clad glass epoxy laminated board. The circuit face was faced with the roughened surface of a rolled copper foil (BHY-22B-T available from Japan Energy Corporation, Rz=1.97 μm) and the polyimide resin sheet obtained in (1) was inserted therebetween. Then, after laminating to the inner layer circuit board, curing was carried out by using a vacuum press at a temperature of 200° C. under a hot-plate pressure of 3 MPa for a pressing time of 2 hours under a vacuum condition of 1 KPa.

(3) The whole copper foil of the laminate obtained in (2) was etched by using ferric chloride etchant.

(4) Via holes of 30 μm in diameter which run to the electrodes were opened directly above electrodes on the inner layer board by a UV-YAG laser.

(5) Subsequently, electroless copper plating was conducted to all over the substrate. The method for forming electroless plating layer is as follows: first, the laminate was cleaned by an alkaline cleaning solution and then a short time of pre-dipping was carried out with acid. Further, platinum was applied and reduction using alkali was conducted in an alkaline solution. Then chemical copper plating in alkali followed. The plating temperature was room temperature and the plating time was 10 minutes. The electrolessly plated copper layer having a thickness of 300 nm was formed by this method.

(6) Coating of liquid photosensitive plating resist (THB320P available from JSR Corporation) was carried out and the resist was dried at 110° C. for 10 minutes to form a resist layer having a thickness of 20 μm. Then, a glass mask having a line/space of 15/15 μm was adhered to the resist layer and exposed for 1 minute with an ultraviolet exposing device of a ultra-high pressure mercury lamp. By impregnating in a developing solution available from JSR Corporation (product name: PD523AD) for 3 minutes, the photosensitized area was removed and a resist pattern having a line/space of 15/15 μm was formed.

(7) A copper pattern having a thickness of 10 μm was formed on the portion where the electrolessly plated copper coating was exposed, by using a copper sulfate plating solution. As for the copper electroplating, pre-rinsing was carried out for 30 seconds in 10% sulfuric acid and then plating was carried out for 20 minutes at room temperature. The current density was 2 A/dm$^2$ and the film thickness was 10 μm.

(8) The plating resist was removed by using acetone.

(9) By immersing in sulfuric acid/hydrogen peroxide etchant for 5 minutes, the portions other than the circuit area of the electrolessly plated copper layer was removed and a printed wiring board was obtained.

The obtained printed wiring board had a line/space almost exactly as the planned value. In addition, the measurement according to EPMA analysis was conducted to observe whether any metal remained on the part from which the feeding layer was removed and there was no remnant metal. Also, the adhesion of the circuit was firm.

EXAMPLE 7

A thermoplastic polyimide resin was prepared in the same manner as in Example 1 except that 1 equivalent 1,3-bis(3-aminophenoxy)benzene (hereinafter APB) was used instead of 0.95 equivalent of APB and 0.05 equivalent of 3,3'-dihydroxy-4,4'-diaminobiphenyl. The prepared polyimide resin had a glass transition temperature of 150° C. The prepared polyimide resin was subjected to the same procedures as in Example 6 and a cured film and a printed wiring board was prepared.

The cured film had an adhesion strength of 12 N/cm to the rolled copper foil, and 7 N/cm to the chemical plated copper, an insulating resistance of $1.5\times10^{16}$ Ωcm, specific dielectric constant of 3.0 and dielectric loss tangent of 0.010.

The prepared printed wiring board had a line/space almost exactly as the planned value. In addition, the measurement according to EPMA analysis was conducted to observe whether any metal remained on the part from which the feeding layer was removed and there was no remnant metal. Also, the adhesion of the circuit was firm.

EXAMPLE 8

A cured film and a printed wiring board were prepared in the same manner as in Example 6 except that the polyimide resin of Example 1 was used.

The cured film had an adhesion strength of 12 N/cm to the rolled copper foil, and 7 N/cm to the chemical plated copper, an insulating resistance of $1.7 \times 10^{16}$ Ωcm, specific dielectric constant of 3.1 and dielectric loss tangent of 0.010.

The prepared printed wiring board had a line/space almost exactly as the planned value. In addition, the measurement according to EPMA analysis was conducted to observe whether any metal remained on the part from which the feeding layer was removed and there was no remnant metal. Also, the adhesion of the circuit was firm.

EXAMPLE 9

A printed wiring board was prepared in the same manner as in Example 6 except that copper foil (rolled copper foil BHY-22B-T available from Japan Energy Corporation, Rz=1.97 μm) was used instead of the polyethylene terephthalate film of 125 μm used as a support in the step (1) of Example 6 and that the polyimide resin composition solution was applied to the roughened surface of the copper foil.

The obtained polyimide resin sheet with metal foil was cured and subjected to the evaluation tests. The sheet had an adhesion strength of 13 N/cm to the rolled copper foil, and 7 N/cm to chemical plated copper, an insulating resistance of $1.7 \times 10^{16}$ Ωcm, specific dielectric constant of 3.1, and dielectric loss tangent of 0.010.

The prepared printed wiring board had a line/space almost exactly as the planned value. In addition, the measurement according to EPMA analysis was conducted to observe whether any metal remained on the part from which the feeding layer was removed and there was no remnant metal. Also, the adhesion of the circuit was firm.

COMPARATIVE EXAMPLE 3

An inner layer circuit board was prepared from 9-μm-thick copper foil-clad glass epoxy laminated board. An epoxy resin sheet for build-up substrate was laminated thereon and curing was carried out at 170° C. for 30 minutes. Next, the insulating substrate was impregnated in a potassium permanganate solution to roughen the surface of the resin layer so that the adhesion property of the electroless plating was improved. Then by carrying out step (4) onward of Example 6, a printed wiring board was obtained.

The Rz value of the resin surface after surface roughening was 3.0 μm. The prepared multi-layer printed wiring board did not have a stable circuit width because the unevenness of the resin surface was great. Moreover, the adhesion strength to the chemical plated copper was 7 N/cm, the insulating resistance was $5.0 \times 10^{13}$ Ωcm, the specific dielectric constant was 3.5, and the dielectric loss tangent was 0.040.

INDUSTRIAL APPLICABILITY

When used as an adhesive, the resin composition of the present invention can be bonded at a comparatively low temperature of about 250° C. Different from conventional heat-resistant adhesive, the resin composition of the present invention does not require a high temperature when bonding, and also exhibit high adhesion strength to a polyimide film while maintaining adhesion strength even in high temperature. Moreover, the resin composition has a high retaining ratio of peeling strength after PCT and such a high soldering heat resistance that no swelling occurs even when immersed in a solder bath. Therefore, the resin composition of the invention is of high industrial value when used as electronic materials requiring high reliability and high heat resistance.

According to the process for a printed wiring board of the present invention in which the polyimide resin sheet or the polyimide resin sheet with metal foil of the present invention is used, an excellent microcircuit can be formed on fine surface irregularities of the polyimide resin composition of the present invention and high adhesion strength can be attained. In addition, because the feeding layer on the fine surface irregularities can be etched efficiently without etching remnant and because the polyimide resin composition of the present invention has high insulating resistance, it is possible to provide high insulating property required for the microcircuit space which will be further narrowed in the future. Also, the polyimide resin sheet and the polyimide resin sheet with metal foil of the present invention can be preferably used for the printed wiring board and the process for preparing the same of the present invention.

What is claimed is:

1. A resin composition comprising:
a polyimide resin and a thermosetting resin except for said polyimide resin, said polymide resin being represented by the following formula (1):

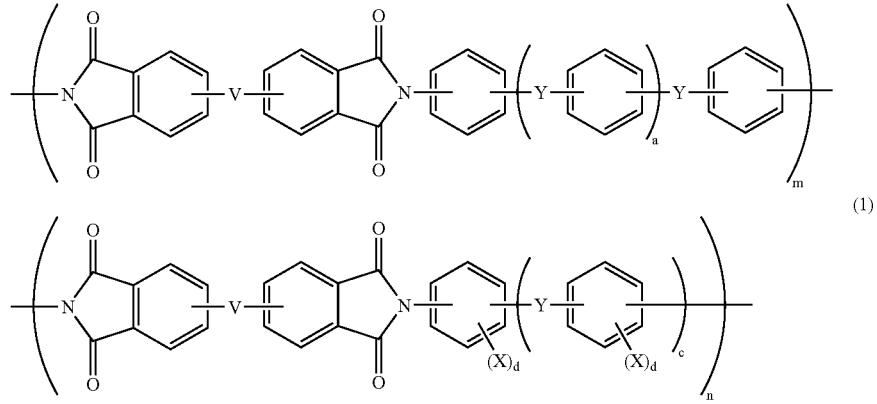

wherein each of m and n is an integer, m≧0, n≧1, and m+n being at least 1;

V represents a divalent group selected from the group consisting of —O—, —O-T-O— and —C(=O)—O-T-O(C=O)—;

T represents a divalent organic group;

Y represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond;

each of a, b and c is independently an integer of at least 0 to at most 5;

X independently represents one or at least two kinds of functional group selected from the group consisting of —OH, —COOH, —OCN and —CN; and d is an integer of 1 to 4.

2. A resin composition for adhesive, comprising, (A) a polyimide resin obtained by allowing an acid dianhydride component to react with a diamine component and (B) a thermosetting resin except for polumide resin, said acid dianhydride component containing an acid dianhydride represented by formula (2):

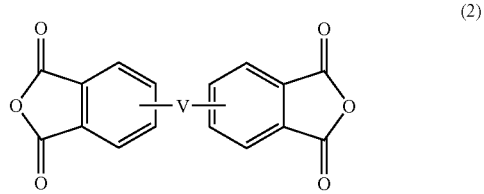

(2)

wherein V represents a divalent group selected from the group consisting of —O—, —O-T-O— and —C(=O)—O-T-O(C=O)—, and T represents a divalent organic group; and said diamine component containing diamine represented by the following formula (4):

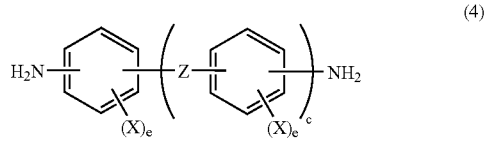

(4)

wherein Z represents an independent divalent organic group selected from the group consisting of —C(=O)—, —SO$_2$—, —O—, —S—, —(CH$_2$)$_b$—, —NHCO—, —C(CH$_3$)$_2$—, —C(CF$_3$)$_2$—, —C(=O)O— and a single bond; each of b and c is independently an integer of at least 0 to at most 5; X independently represents one or at least two kinds of functional group selected from the group consisting of —OH, —COOH, —OCN and —CN; e is an integer of 1 to 4.

3. The resin composition of claim 2, wherein said diamine represented by the formula (4) is diamine containing a hydroxyl group.

4. The resin composition of claim 1 or 2, wherein T in the formula (2) is selected from the group consisting of groups represented by

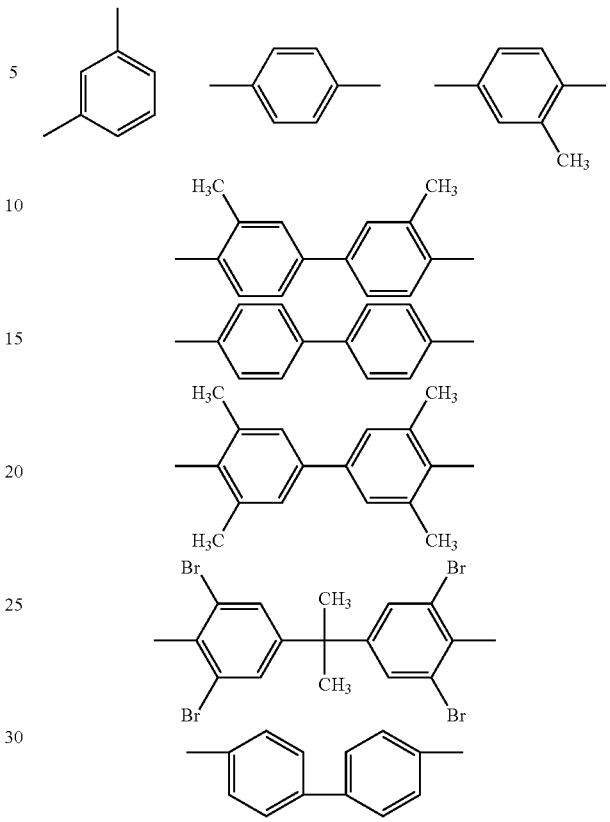

and groups represented by

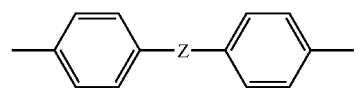

in which Z represents —C$_q$H$_2$q- and q is an integer of at least 1 to at most 5.

5. The resin composition of claim 2, wherein said diamine represented by the formula (4) is 3,3'-dihydroxy-4,4'-diaminobiphenyl represented by the following formula:

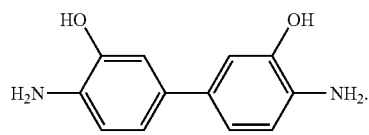

6. The resin composition of claim 1 or 2, wherein said polyimide resin (A) has a glass transition temperature Tg of at most 350° C.

7. The resin composition of claim 1 or 2, further comprising a solvent having a boiling point of at most 160° C.

8. A resin sheet containing the resin composition of claim 1 or 2.

* * * * *